United States Patent
Bhandari

(10) Patent No.: US 7,184,936 B1
(45) Date of Patent: Feb. 27, 2007

(54) TIMING VARIATION MEASUREMENT SYSTEM AND METHOD

(75) Inventor: Ajay Bhandari, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/890,072

(22) Filed: Jul. 12, 2004

(51) Int. Cl.
*G01R 23/175* (2006.01)

(52) U.S. Cl. .................. 702/189; 702/69; 702/78; 702/79; 702/104; 327/158; 327/250; 324/76.54

(58) Field of Classification Search ............... 702/69, 702/78, 189, 79, 104; 327/158, 250; 324/76.16, 324/76.35, 76.39, 76.54, 76.62
See application file for complete search history.

(56) References Cited

U.S. PATENT DOCUMENTS

| | | | |
|---|---|---|---|
| 5,923,676 A * | 7/1999 | Sunter et al. ............... 714/733 |
| 6,437,619 B2 * | 8/2002 | Okuda et al. ............... 327/158 |
| 6,597,753 B1 * | 7/2003 | Okayasu et al. ............ 375/373 |
| 6,606,575 B2 * | 8/2003 | Miller ........................ 702/104 |
| 6,807,243 B2 * | 10/2004 | Okayasu et al. ............ 375/371 |
| 6,850,051 B2 * | 2/2005 | Roberts et al. ............. 324/76.54 |
| 2002/0049554 A1 * | 4/2002 | Miller ........................ 702/104 |
| 2002/0180500 A1 * | 12/2002 | Okuda et al. ............... 327/158 |
| 2003/0006750 A1 * | 1/2003 | Roberts et al. ............. 324/76.53 |
| 2003/0194038 A1 * | 10/2003 | Okayasu et al. ............ 375/373 |
| 2005/0028050 A1 * | 2/2005 | Ganry ......................... 714/700 |
| 2005/0036578 A1 * | 2/2005 | Heidel et al. ............... 375/371 |
| 2005/0204211 A1 * | 9/2005 | Gouin et al. ................ 714/702 |

* cited by examiner

*Primary Examiner*—Carol S. W. Tsai
(74) *Attorney, Agent, or Firm*—Marger Johnson & McCollom, PC

(57) ABSTRACT

The present invention is a system and method that facilitates measurement of timing variations (e.g., timing delays) in a semiconductor chip. The timing variations are measured and presented as digital values without extensive off chip measurement and analysis equipment. The timing variation measurements provides insight into timing variations (e.g., delays) inside a semiconductor chip and across different chips, including timing impacts experienced in end use after manufacturing. A timing variation measurement system includes a variation test signal generator for passing a signal through a portion of a circuit and generating a variation test signal. A variation test signal tracking component digitally counts cycles in a variation test signal and a control component controls the counting (e.g., the length of time the cycles are counted). Timing variation information, including a digital value associated with the variation test signal cycle count, can be communicated via pins and/or a processor interface.

19 Claims, 5 Drawing Sheets

TIMING VARIATION MEASUREMENT SYSTEM AND METHOD

FIELD OF THE INVENTION

This invention relates to the field of semiconductor devices. In particular, the present invention relates to measuring timing variations in a semiconductor chip.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems facilitate increased productivity and cost reductions in analyzing and communicating data, ideas and trends in most areas of business, science, education and entertainment. The timing of operations within a system or circuit is often critical to the proper performance of a device in providing proper results. However, a number of conditions can adversely impact the timing of various operations. For example, fabrication process deviations, voltage drops, and temperature can cause various signal timing variations (e.g., delays) in semiconductor components. Accurate measurement of the timing variations is very important for correct and reliable device performance.

There are a number of different causes of signal timing variations for circuits on different semiconductor chips. For example, changes in device parameters (e.g., transistor parameters) and interconnect metal layer characteristics (e.g., dielectric characteristics) often result in fabrication process discrepancies that produce timing delay variations. The fabrication process discrepancies often produce timing differences or shifts across wafer to wafer, chip to chip, and/or within a chip. Differences in operating temperatures and voltage drops (IR) can also impact timing variations.

Timing variations or differences can have detrimental impacts on the performance of the semiconductor components and uniformity of results. Traditionally, "timing closures" for design are developed to account for and coordinate different timing variations or shifts. For example, designs are often "timing closed" with assumed on chip variation (OCV) numbers and/or with increased timing margin values. Even when timing closure is performed, very little information regarding the actual timing variations and actual timing closure performed on a semiconductor chip typically comes back to the designer for potential use designing future versions or implementations.

It is traditionally very difficult for a designer to determine if problems in a silicon chip performance are related to uneven timing delays. Traditional attempts at measuring timing delays are usually limited and require significant internal and external chip resources. For example, conventional wafer test measurements are often limited to a relatively few places or locations on a wafer (e.g., a process corner). This does not typically provide very good insight to process variations that are encountered in other areas of a chip and from chip to chip. In addition, the actual layout of chip components (e.g., logic units, functional components, gates, etc) can vary (e.g., between chips manufactured at different foundries) making it more difficult to determine impacts on any particular component related to timing variations since the location of a component with respect to a corner measurement can vary.

Traditional attempts at timing variation detection often involve utilizing ring oscillators to obtain an analog indication of a frequency measurement. However, the logistics of traditional attempts at directly measuring and retrieving analog frequency information from ring oscillators makes it very difficult and expensive. Conventional approaches usually involve direct analog measurements of a frequency in which an analog signal is brought off chip and automated test equipment (ATE), oscilloscopes, and/or logic analyzers are used to measure the analog signal. In addition, the analog signals from the ring oscillators traditionally have to be brought off of the chip via dedicated valuable chip input and output (I/O) resources (e.g., bumps, pins). Also, the measurements are typically performed as wafer tests and not performed across wafer lots, making it very difficult for a designer to identify and analyze delay variations for a component across different wafer lots. In addition, information typically available to designers is usually very limited due to the I/O resource consumption requirements of traditional approaches.

Traditional tests are also usually only one time measurements during manufacturing. For example, delay test bumps are not coupled to package pins and so even through a ring oscillator is present in a die, timing variation measurements are not available once the die is packaged. However, timing variations can change over time and adversely impact use of a product in the field after manufacturing.

As the demand for ever more advanced and complicated applications increases, the need for more precise and robust timing variation detection becomes critical. At the same time, decreases in component sizes are making components more sensitive to process, voltage and temperature variations that result in even greater timing delay impacts. For example, in state of the art deep sub micron semiconductor processes the overall process variation is quite large varying in the order of 2 to 2.5 times from best case to worst case operating conditions in the 0.13 um process mode.

SUMMARY

The present invention is a system and method that facilitates measurement of timing variations (e.g., timing delays) in a semiconductor chip. The present invention can be utilized to monitor timing variations spatially between different locations inside a chip. The present invention provides insight into timing variations inside a semiconductor chip and across different chips. Timing degradation and variations that affect reliability can also be captured over longer periods of time, during end use in the field after manufacturing. In addition, the timing variation information can be utilized to accurately model on chip variations in subsequently manufactured semiconductor chips and assist with timing closure procedures. For example, the timing variation information can be utilized to compare various semiconductor processes with respect to process variation ranges.

In one embodiment of the present invention, a timing variation measurement system includes a variation test signal generator, a variation test signal tracking component and a control component. The variation test signal generator passes a signal through a portion of a circuit in a semiconductor hip and generates a variation test signal. The timing variation signal corresponds to timing impacts encountered in an area of the semiconductor chip where the circuit is located. The variation test signal tracking component digitally tracking cycles in the variation test signal. The control component controls the period of time in which the variation test signal tracking component tracks the digital the variation test signal cycle count. Timing variation information can be communicated via pins and/or a processor interface. In one exemplary implementation, the present invention includes a variation determination component for determining a variation between the variation test signal and a known frequency signal. For example, the variation determination component performs a ratio comparison of a variation test signal cycle count from the variation test signal tracking component to a count of cycles in a known frequency signal during the same time period.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Figure 1:
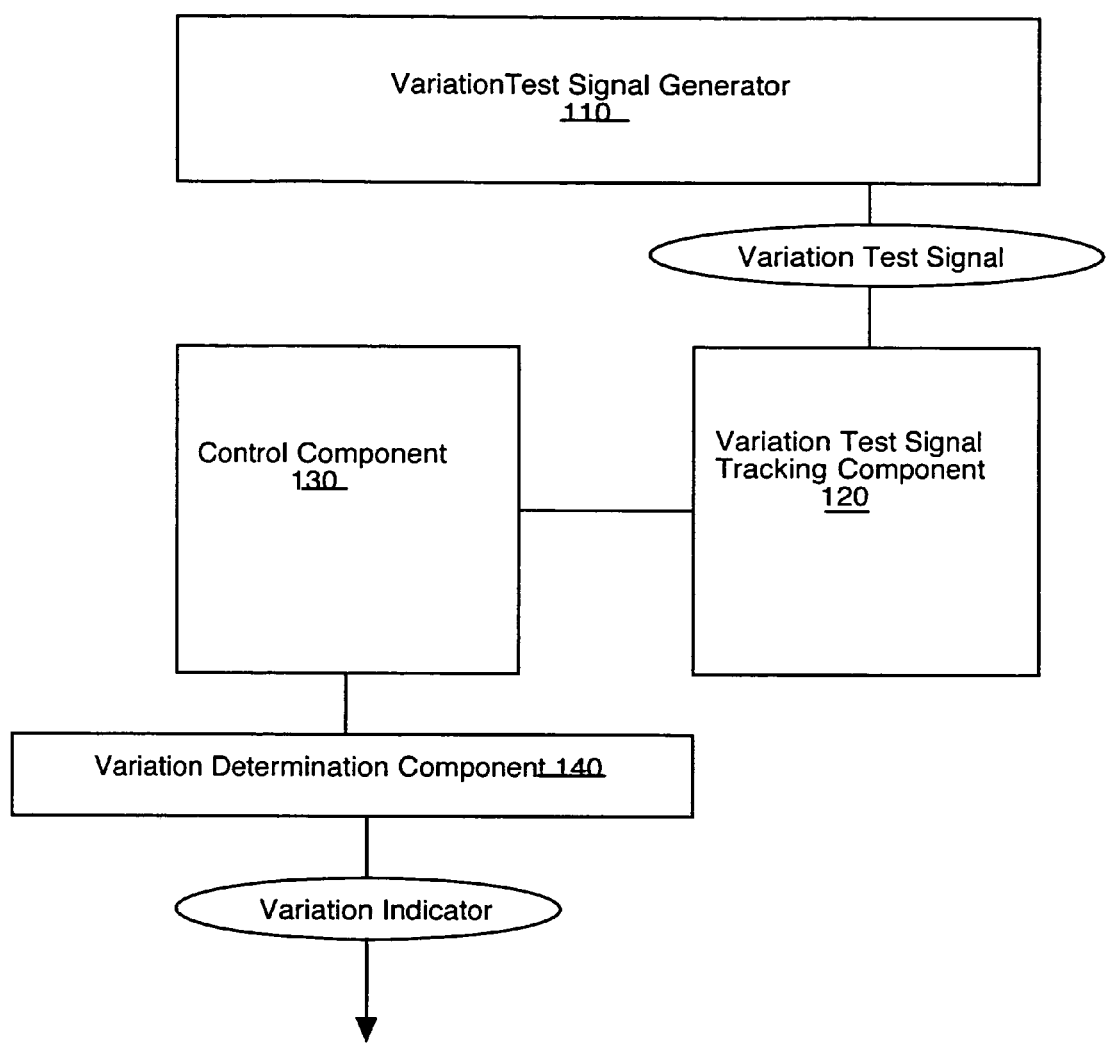
FIG. 1 is a block diagram of a timing variation measurement system in accordance with one embodiment of the present invention.

FIG. 1 is a block diagram of timing variation measurement system 100 in accordance with one embodiment of the present invention. Timing variation measurement system 100 includes variation test signal generator 110, variation test signal tracking component 120, control component 130 and variation determination component 140. Variation test signal generator 110 is coupled to variation test signal tracking component 120 which is coupled to control component 130. Control component 130 is coupled to variation determination component 140. In one embodiment, components of timing variation measurement system 100 are included in a single chip and provide n "on chip variation" measurement.

The components of timing variation measurement system 100 cooperatively operate to measure timing variations in a portion of a silicon chip. Variation test signal generator 110 passes a signal through a portion of a circuit and outputs a variation test signal. In one embodiment, variation test signal generator 110 is a ring oscillator. Variation test signal tracking component 120 digitally tracks the frequency of the variation test signal and outputs a digital value. In one exemplary implementation, variation test signal tracking component 120 is a counter that counts cycles in the variation test signal. Control component 130 controls variation test signal tracking component 120. For example, control component 130 tracks the frequency of the variation test signal for a period of time indicated by control component 130. In one embodiment, control component 130 determines the period of time based upon a known clock frequency. Variation determination component 140 determines a variation between the variation test signal and a known frequency signal. It is appreciated that variation determination component 140 can have a variety of embodiments including a processor, an ASIC, dedicated logic, etc. In one exemplary implementation, variation determination component 140 performs a ratio comparison of a variation test signal cycle count from variation test signal tracking component 120 to a known frequency signal cycle count during the same period of time. Variation determination component 140 provides a digital indication of the variation.

Figure 2:
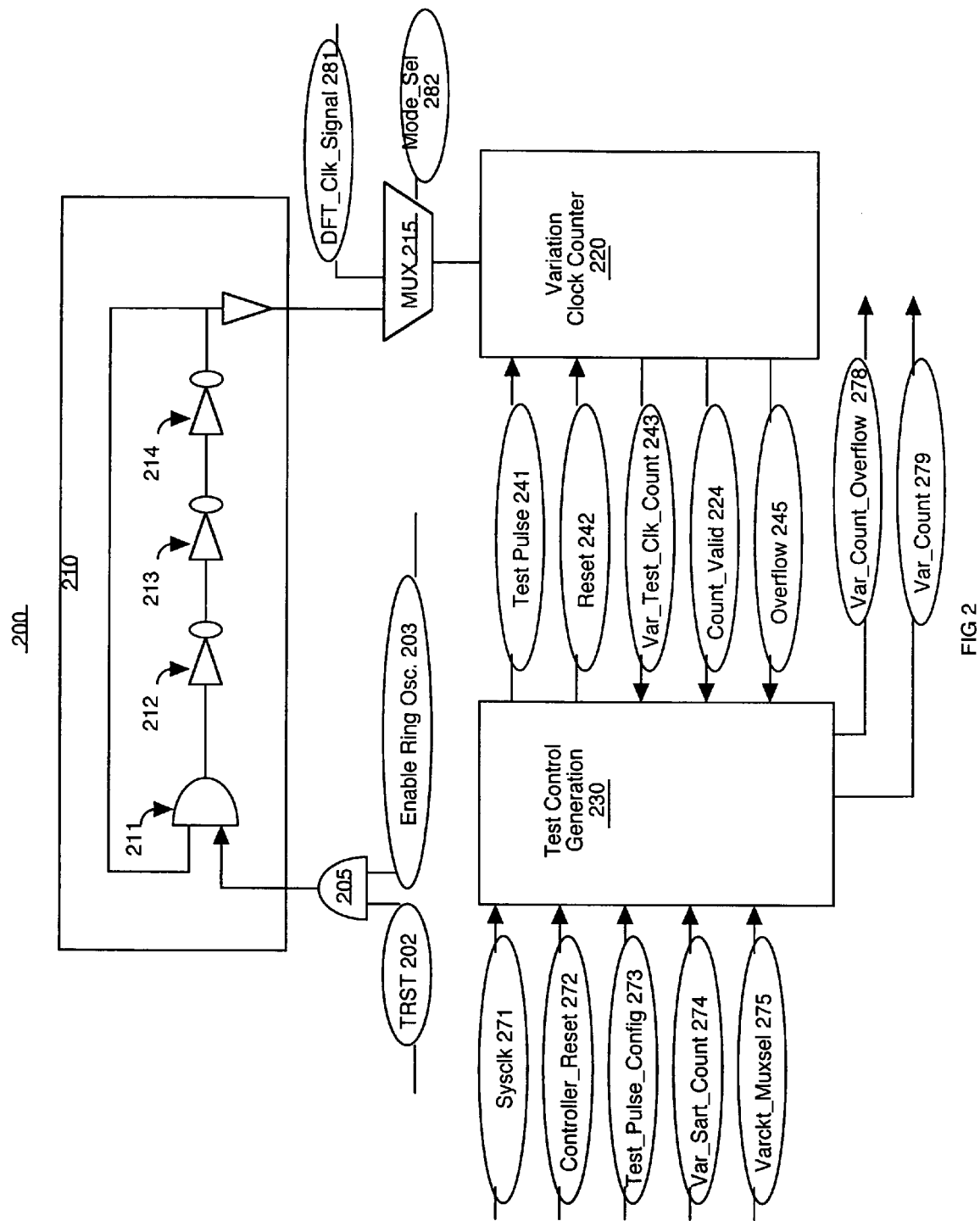
FIG. 2 is a block diagram of another timing variation measurement system in accordance with one embodiment of the present invention.

FIG. 2 is a block diagram of timing variation measurement system 200 for measuring timing variations in a semiconductor chip in accordance with one embodiment of the present invention. Timing variation measurement system 200 includes variation based clock generator 210, variation clock counter 220 and test control generator 230. Variation based clock generator 210, is coupled to variation clock counter 220 which in turn is coupled to test control generator 230. Timing variation measurement system 200 also includes optional test clock initiation component 205 and optional design for test (DFT) component 215. Optional test dock initiation component 205 is coupled to variation based clock generator 210. Optional design for test (DFT) component 215 is coupled to variation clock counter 220.

Timing variation measurement system 200 is similar to timing variation measurement system 100. For example, variation based clock generator 210 is similar to variation test signal generator 110 and variation clock counter 220 is similar to variation test signal tracking component 120. The components of timing variation measurement system 200 cooperatively operate to perform variation testing. Variation based clock generator 210 passes a signal through a portion of a semiconductor chip to produce a variation test clock signal. In one embodiment of the present invention, variation based clock generator 210 includes an odd numbered series of inverters (e.g., 212, 213, and 214) coupled in a daisy chain fashion to form a ring oscillator. Variation based clock generator 210 also includes an on/off component (e.g., AND gate 211) in the beginning of the daisy chain allowing the ring oscillator to be turned on and off. In one exemplary implementation, the ring oscillator is in a reset asserted condition during normal chip operations. During variation testing the reset is deasserted (e.g., disabled).

In one embodiment of the present invention, the timing delays in the ring oscillator chain depends upon various deviations resulting from fabrication processes, different voltage drops and temperature conditions of the components in the ring oscillator chain. The resulting variation test clock signal frequency is proportional to the timing changes (e.g., delays) introduced throughout the whole chain of ring oscillator logic. Physically, the ring oscillator can be isolated from surrounding logic in the semiconductor chip. Different stages of the ring oscillator (e.g., between inverters) can be located in different metal layers of a semiconductor chip to capture the effect of metal variations. In one exemplary implementation, variation based clock generator 210 can also "see" the same surroundings from all sides regardless of where it is placed on the chip. Variation based clock generator 210 forwards the variation test clock signal to variation clock counter 220.

Variation clock counter 220 counts cycles in the variation test clock signal. For example, the variation test clock signal is used to clock a counter in variation clock counter 220. Variation clock counter 220 counts the cycles in the variation test clock signal for a period of time (e.g., as indicated by test control generator 230). The count is an indicator of the variation conditions (e.g., timing variations due to process, voltage drop, and temperature) in the semiconductor chip area of variation based clock generator 210. For example, if a greater count is produced it is an indication the frequency of the variation test signal is higher and if a lower count is produced it is an indication the frequency of the variation test signal is lower.

Test control generator 230 controls variation based clock counter 220. In one embodiment, test control generator 230 forwards a test pulse signal 241 to variation clock counter 220. The assertion and deassertion of the test pulse signal 241 defines the time period in which variation clock counter 220 counts the number of cycles in the variation test clock signal. For example, variation clock counter 220 counts the number of cycles in the variation test clock signal while the test pulse signal 241 is asserted (e.g., high) and ceases counting when the test pulse signal 241 is deasserted (e.g., low). Test control generator 230 asserts test pulse signal 241 when variation test start signal ($Var_{13}Test\_Start$) 274 is asserted and test control generator 230 also starts to count cycles in the known frequency clock signal 271 when variation test start signal ($Var_{13}Test\_Start$) 274 is asserted.

Test control generator 230 counts the signal cycles in the known frequency signal 271 until a specified test pulse configuration count is reached and then deasserts test pulse signal 241. When test pulse signal 241 is deasserted variation clock counter 220 stops count variation test clock cycles and forwards the count to test control generator 230 on variation test clock count signal (Var_Test_Clk_Count) 243. The test pulse configuration (e.g., the length of time it is asserted) is specified by test pulse configuration signal (Test_Pulse_Config) 273. In one exemplary implementation, test pulse configuration signal (Test_Pulse_Config) 273 indicates a count corresponding to a number of cycles in a known frequency signal (e.g., a system clock signal) and test control generator 230 utilizes the count to define the period or length of time the test pulse configuration signal 273 is asserted. For example, if test pulse configuration signal 273 indicates a count value of 1,000 when test control generator asserts test pulse signal 241, test control generator also starts counting cycles of a know frequency signal 271 until 1,000 cycles are counted and then deasserts test pulse signal 241.

Test control generator 230 forwards a digital value indicating the variation test signal cycle count (e.g., corresponding to variation test clock cycle count signal 243) to a variation determination component (not shown). For example, test control generator 230 forwards a digital value via a variation test count signal 279. In one embodiment, the variation determination component is included on the same semiconductor chip as timing variation measurement system 200. In one embodiment, the digital value is forwarded to an off chip variation determination component.

In one embodiment, the test pulse signal is used to synchronize components (e.g., variation clock counter 220 and test control generator 230) operating in two different time domains. For example, a counter in variation clock counter 220 operating in an unknown variation clock signal time domain and a counter in test control generator 230 operating in a known frequency signal (e.g. system clock) time domain operate in two different time domains and without coordination are basically asynchronous. By counting cycles in both variation clock signal and known frequency signal during the same time period defined by the assertion of the test pulse signal the counting operations are synchronized. Synchronization is also facilitated by another asynchronous handshaking signal that validates the count indicated by variation test clock count signal 243. For example, count valid signal (Count_Valid) 244 is asserted when variation clock counter 220 stops counting, providing an indication that the count is available and valid across the two clock domains In one embodiment of the present invention, components of system 200 are reset before variation testing is initiated. For example, controller reset signal (Controller_Reset) 272 is asserted to reset test control generator 230 components (e.g., flip flops) and variation clock counter signal (Var-Clk_Cnt_Reset) 242 is asserted to reset variation clock counter 220.

It is appreciated test control generator 230 can forward the variation test signal cycle count via a single bus line or multiple line bus (e.g., 16 line bus). For example, variation test cycle count signal 279 is communicated via multiple bus lines. In one exemplary multiple bus line implementation, variation count overflow indicators are forwarded to indicate that the variation test signal cycle count exceeded the limit of the variation test cycle count bus (e.g., a count higher than a maximum 16 bit value on a 16 line bus).

The test pulse signal can be adjusted to accommodate a number of testing issues. In one embodiment, when an overflow is indicated the test time (e.g., duration of test pulse signal 241) is shortened so that the count does not over flow. The test pulse configuration signal 273 can also impact the accuracy available out of the system 200. Adjusting the value of the test pulse configuration signal 273 to a larger number and increasing the duration of test pulse signal 241 permits a greater sample of variation test clock signal cycles to be counted providing a better sample. For example, if synchronization between a know frequency clock and a ring oscillator clock is slightly off (e.g., by 2 counts) increasing the test duration permits a higher count in variation test signal cycles which can produce greater accuracy since a greater variation test signal cycle count is proportionally less impacted by a slight synchronization deviation.

Test clock initiation component 205 is utilized to provide additional enablement control of variation test clock signal generation by variation test clock generator 210. For example, enable ring oscillator (Enable_ring_osc) signal 203 can be forwarded from an I/O pin to test clock initiation component 205. The enable ring oscillator (Enable_ring_osc) signal 203 can also be forwarded from an on chip processor. Test reset signal (TRST) 202 can be a built in self test (BIST) signal to coordinate variation testing with BIST operations (e.g., JTAG operations).

With reference still to FIG. 2, optional design for test (DFT) component 215 permits testing of variation clock counter 220 and test control generator 230. In one embodiment of the present invention, DFT component 215 is a multiplexer component (MUX). Mode select signal (Mode_Sel) 282 permits selection between a normal operation mode and a design for test mode. For example, mode select signal 282 directs DFT component 215 to select either a variation test clock signal from variation test clock signal generator 220 or a design for test signal 281 for communication to variation clock counter 220. Design for test signal 281 can be an internal signal (e.g., of a know frequency) or an external signal (e.g., an off chip test signal).

Figure 3:
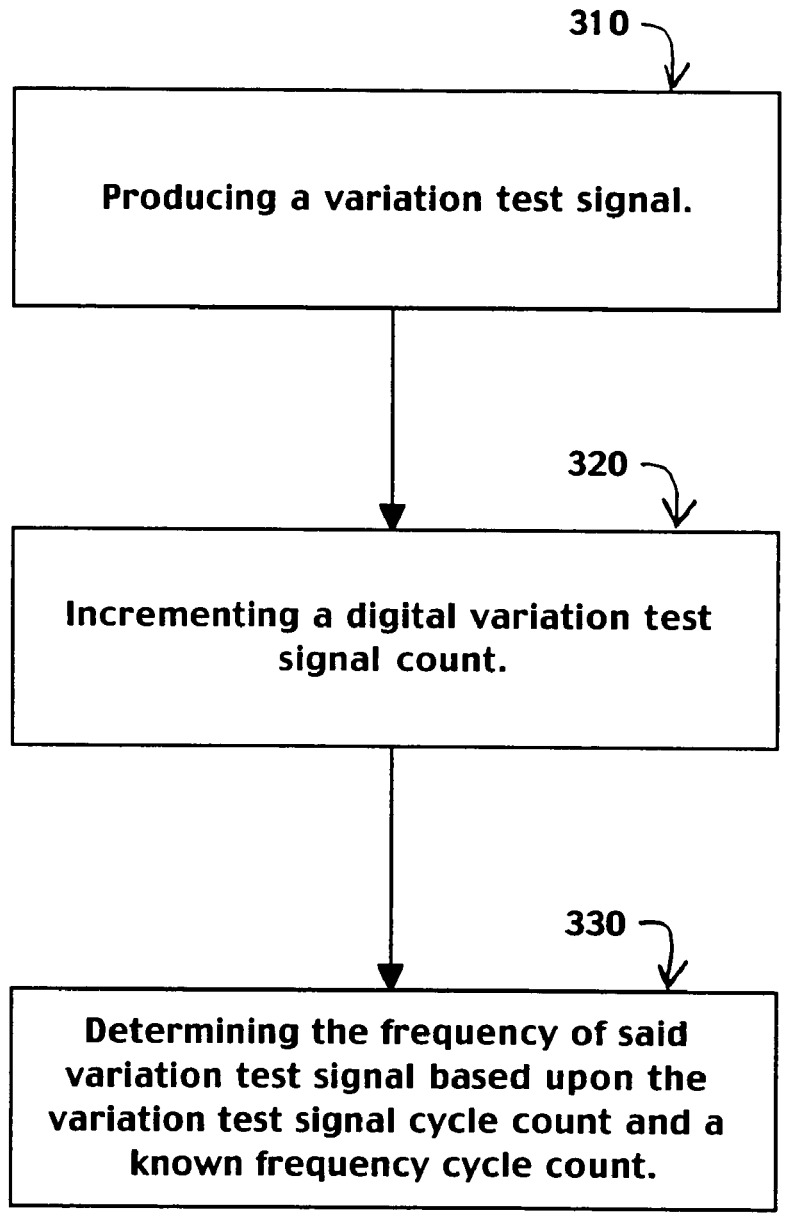
FIG. 3 is a flow chart of a timing variation measurement method in accordance with one embodiment of the present invention.

FIG. 3 is a flow chart of a timing variation measurement method 300 in accordance with one embodiment of the present invention. Timing variation method 300 provides a digital measurement of timing variations in a silicon chip.

In step 310, a variation test signal is produced. The frequency of the variation test signal corresponds to timing impacts encounter in an area of a semiconductor chip. In one embodiment of the present invention, a variation test signal is produced by propagating a signal through a portion of a circuit. For example, a signal is propagated through an odd number of inverters (e.g., inverters 212, 213, and 214) coupled in a daisy chain series fashion to form a ring oscillator. The variation test signal frequency is determined by the components the signal is propagated through. For example, the frequency is impacted by fabrication process idiosyncrasies of the components, voltage drop characteristics of the components and temperature of the components.

In step 320, a digital variation test signal cycle count corresponding to cycles in said timing variation signal is incremented. The digital variation test signal cycle count is incremented for a specified period of time. In one embodiment, the digital variation test signal cycle count is incremented by a digital counter clocked by the timing variation signal. The cycles in the variation test signal are counted for a specified length of time.

In step 330, the frequency of the variation test signal is determined based upon the cycles of the test signal and cycles of a known frequency signal for the same period of time. For example, the known frequency is a system clock frequency. A digital value indication of a variation between the frequency of the test signal and the known frequency is produced. In one exemplary implementation, the ratio of the variation test cycles and a frequency of the variation test signal is compared to a ratio of the known cycle and frequency. A timing variation is also determined.

In one embodiment of the present invention, a proportional relationship between a known frequency signal and the variation test clock signal is utilized to resolve timing variations in the semiconductor chip. In one exemplary implementation, the relationship is defined as:

$$\frac{KFSCC}{KF} = \frac{VCSCC}{VCSF}$$

or alternatively expressed as:

$VCSF = (VCSCC * KF) / KFSCC$ where KFSCC is the Known Frequency Cycle Count, KF is the Known Frequency, VCSCC is the variation clock signal cycle count and VCSF is the variation clock signal frequency.

The variation clock signal cycle count (VCSCC) is utilized to determine the timing delay or variation. The timing delay or variation defined as $DV = 1/(2 * VCSF)$ where DV is the delay variation and VCSCC is the variation clock signal cycle count. The percent change in delay at any two locations in the semiconductor chip is defined as:

$(DV1 - DV2) * 100 / DV1$ where DV1 is the delay variation at a first location in the semiconductor chip and DV2 is a delay variation at a second location in the semiconductor chip. For convenience, the percent change in delay at any two locations in the semiconductor chip can also be defined as:

$(VCSCC2 - VCSCC1) * 100 / VCSCC2$ where VCSCC1 is the variation clock signal cycle count at a first location in the semiconductor chip and VCSCC2 is the variation clock signal cycle count at a second location semiconductor chip.

Figure 4:
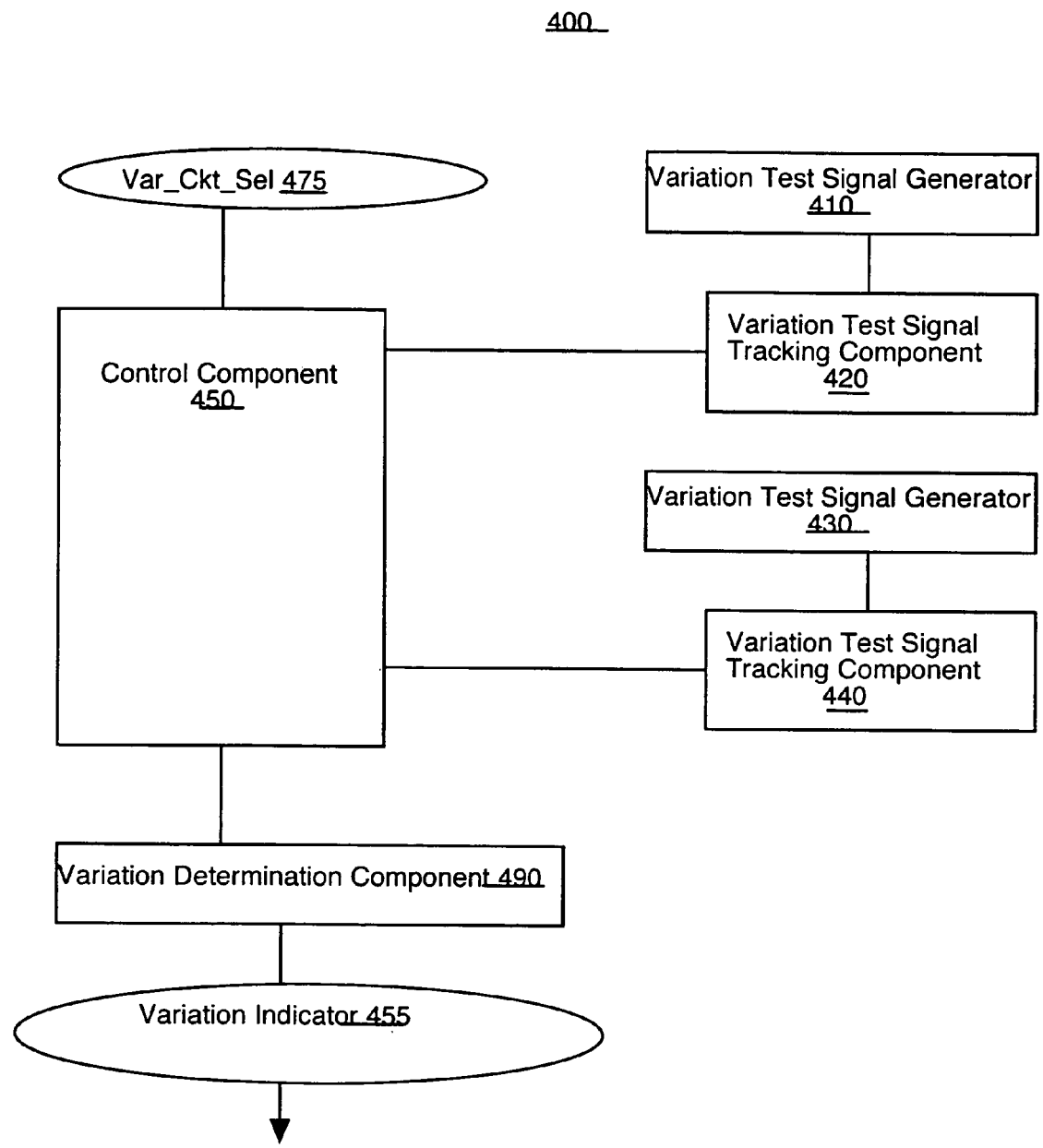
FIG. 4 is a block diagram of an exemplary implementation of timing variation measurement system with a plurality of variation test signal generators in accordance with one embodiment of the present invention.

It is appreciated the present invention is flexible and extendable to a variety of test coverage configurations. For example, embodiments of the present invention can include a plurality of variation test signal generators spread throughout a semiconductor chip. FIG. 4 is a block diagram of one exemplary implementation of timing variation measurement system 400 with a plurality of variation test signal generators in accordance with one embodiment of the present invention. Timing variation measurement system 400 includes variation test signal generator 410, variation test signal tracking component 420, test signal generator 430, variation test signal tracking component 440, control component 450 and variation determination component 490. The components of timing variation measurement system 400 are similar to corresponding components of timing variation measurement system 100 and 200. For example variation test signal generators 310 and 330 are similar to variation test signal generator 110 and variation test clock generator 210.

Control component 450 is similar to control components 130 and 230 and is utilized to control a plurality of variation test signal tracking components (e.g., 420 and 440). Which variation test signal tracking component (e.g., 320, 340, etc) is being controlled by control component 450 at any given time is defined by variation circuit select signal 475. In one embodiment of the present invention, variation circuit select signal 475 is utilized to control selection on a multiplexer circuit. For example, with reference to FIG. 2 variation circuit MUX select signal 275 can be utilized to select other variation clock counters (not shown) in addition to variation clock counter 220.

It is appreciated that a present invention variation clock signal generator can be initiated by a variety of mechanisms. In reference to timing variation system 200 shown in FIG. 2 for example, variation clock signal generator enable signal 203 can be communicated to the variation clock signal generator 210. The variation clock signal generator enable signal can be communicated from off chi via a I/O pin, from an internal logic component (e.g., a CPU, etc.) and the variation clock signal generator enable signal can be coordinated with other operations (e.g., built in self testing, etc). For example, the variation testing can be controlled by on chip processing components. In system 200, the ring oscillator variation clock signal generator 210 is initiated by a combination of enable ring oscillator signal 203 and test reset signal 202.

It is also appreciated that there are a variety of ways the present invention can communicate a frequency and/or frequency variation off chip. For example, a digital value indication of a frequency and/or frequency variation can be communicated off chip via a processor interface (e.g., a CPU bus line, debug bus line, etc.). The count values can be put in a central processing unit (CPU) register for reading through the CPU interface. A digital value indication of a frequency and/or frequency variation can also be communicated off chip via an IO pin. The on chip timing variation measuring systems can be multiplexed to interface with one set of CPU registers.

Figure 5:
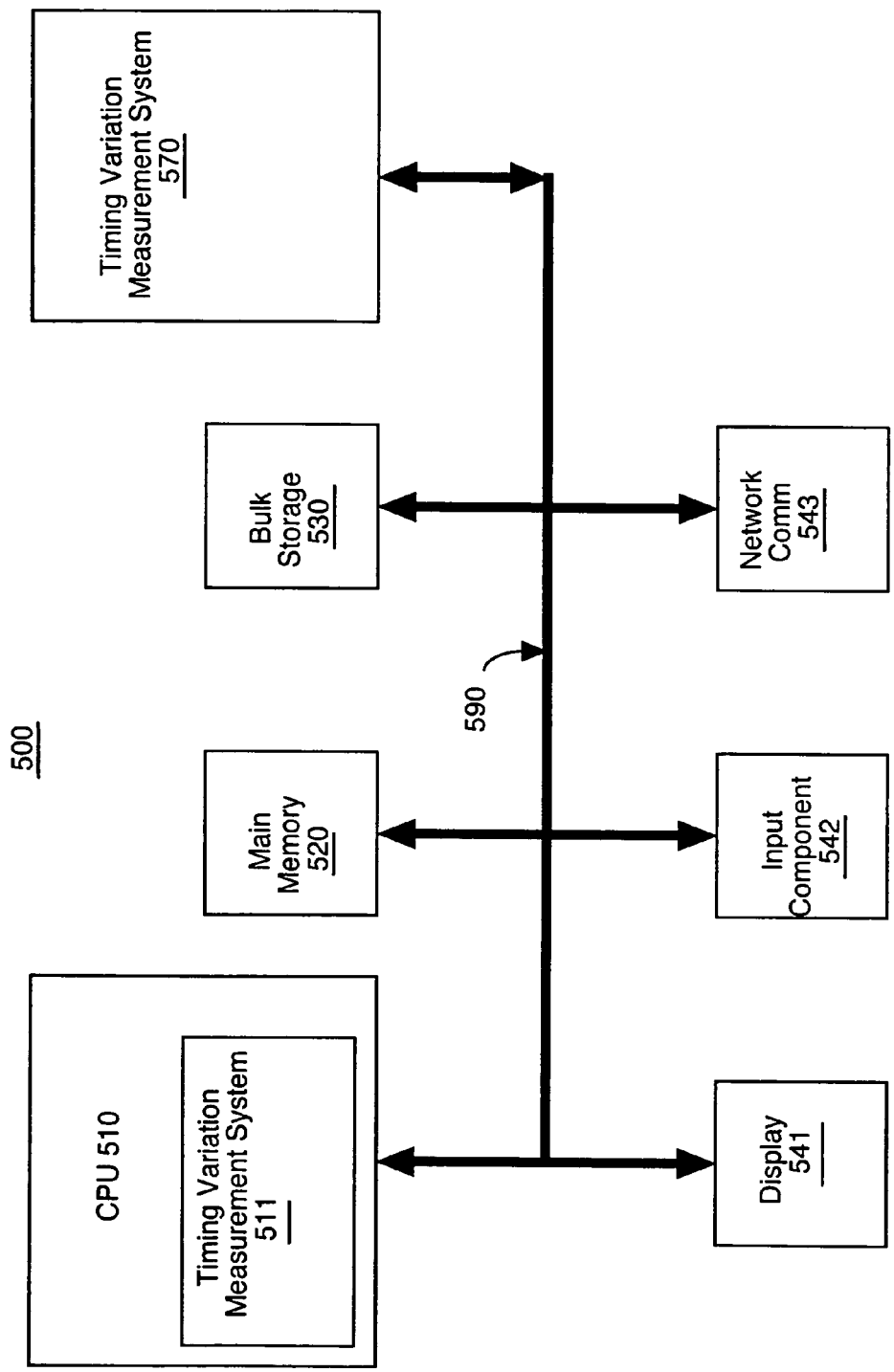
FIG. 5 is a block diagram of a timing variation analysis system in accordance with one embodiment of the present invention.

FIG. 5 is a block diagram of timing variation analysis system 500 in accordance with one embodiment of the present invention. In general, timing variation analysis system 500 comprises a bus 590 coupled to a central processor 510, a random access memory 520, a bulk data storage device 530 (e.g., hard disk, CD, DVD, etc), a display device 541, an input device 542 (e.g., keyboard, cursor, etc.), and network communication component 533 (e.g. a communication port). In one embodiment, central processing unit 510 includes a timing variation measurement system 511. Timing variation analysis system 500 can also include a timing variation measurement system 570 coupled to bus 590.

The components of cooperatively operate to perform their designated functions timing variation analysis system 500. Central processor 510 processes information and instructions including instructions associated with a timing variation measurement method (e.g., a timing variation measurement method 300). Random access memory 520 is a computer readable medium for storing information and instructions for the central processor 510 including information and instructions associated with the timing variation measurement method. Bulk data storage device 530 is also a computer readable medium for stores information and instructions, including information and instructions associated with the timing variation measurement method. Display device 541 displays information to a user. Input device 542 includes communicates input information and command selections to the central processor 510. Bus 590 is a path for communicating information. Timing variation measurement system 511 and timing variation measurement system 570 measure timing variations in a semiconductor chip. For example, timing variation measurement system 511 and 570 are similar to timing variation measurement systems 100, 200, and 400.

Thus, the present invention is a system and method that facilitates the capture and analysis of timing variation information (e.g., timing delay information). A digital value representing the timing variations is obtained on chip without bringing analog signals off chip and/or utilizing external testing equipment. In addition, the digital value representation can be communicating via existing interfaces (e.g., a CPU interface) without consuming additional I/O pins dedicated for timing variation measurements. The present invention can be utilized to monitor timing variations inside a chip spatially and to monitor changes over the life of a component (e.g., during end use). Insight into the timing variations inside a semiconductor chip and across different chips is provided. Timing degradation and variations that affect reliability can be captured over longer periods of time, including after manufacturing and while being used in the field. In addition, the timing variation information can be utilized to accurately model on chip variation in subsequently manufactured semiconductor chips and can also be utilized in timing closure procedures. For example, the timing variation information can be utilized to compare various semiconductor processes with respect to process variation ranges.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A system comprising:
   a variation test signal generator for passing a signal through a portion of a semiconductor chip and generating a variation test signal, wherein the frequency of said variation test signal corresponds to timing impacts encountered in said portion of said semiconductor chip;
   a variation test signal tracking component for digitally tracking cycles in said variation test signal;
   a control component for controlling a period of time in which said variation test signal tracking component tracks said cycles in said variation test signal; and
   a variation determination component for determining a variation between said variation test signal and a known frequency signal, wherein said variation determination component performs a ratio comparison of a variation test signal cycle count from said variation test signal tracking component to a count of cycles in a known system clock frequency signal during said period of time, and wherein said variation determination component provides a digital indication of a timing variation for said portion of said semiconductor chip.

2. The system of claim 1 wherein said variation test signal generator is a ring oscillator.

3. The system of claim 1 wherein said variation test signal tracking component includes a counter for counting cycles in said variation test signal.

4. The system of claim 1 wherein said control component determines said period of time based upon a known clock frequency.

5. The system of claim 1 wherein said variation determination component is a central processing unit.

6. A method comprising:
   producing a timing variation signal, wherein a frequency of said timing variation signal corresponds to timing impacts encountered in an area of a semiconductor chip, wherein the frequency of said timing variation signal is determined by the components said timing variation signal is propagated through, and wherein said timing variation signal is adjustable to accommodate testing issues;
   incrementing a digital variation test signal cycle count corresponding to cycles in said timing variation signal during a period of time; and
   determining a frequency of said timing variation signal based upon said timing variation signal cycle count and a known frequency signal cycle count in said period of time, wherein said determining produces a digital value indication of a variation of said frequency from a known frequency, wherein said determining includes comparing a ratio of cycles and a frequency of said signal to a known cycle and frequency ratio, and wherein said known frequency is a system clock frequency.

7. The timing variation measurement method of claim 6 wherein said determining produces a digital value indication of said frequency.

8. The timing variation measurement method of claim 6 wherein said digital variation test signal cycle count is incremented by a digital counter docked by said timing variation signal.

9. A system comprising:
a variation based clock generator for passing a signal through a portion of a semiconductor chip and generating a variation test clock signal, wherein the frequency of said variation test signal corresponds to timing impacts encountered in said portion of said semiconductor chip, wherein the frequency of said variation test clock signal is determined by the components said variation test clock signal is propagated through, and wherein said variation test clock signal is adjustable to accommodate testing issues;
a variation clock counter for digitally counting cycles in said variation test clock signal;
a test control generator for controlling said variation clock counter; and
a variation determination component for determining the variation between said variation test clock signal frequency and a known frequency wherein said variation determination component performs a ratio comparison of a variation test clock signal cycle count from said variation clock counter to a count of cycles in a known system clock frequency signal during said period of time, and wherein said variation determination component provides a digital indication of a timing variation for said portion of said semiconductor chip.

10. The system of claim 9 wherein said variation based clock generator is a ring oscillator.

11. The system of claim 10 wherein said ring oscillator is a series of odd numbered inverters coupled in a chain.

12. The system of claim 10 wherein said ring oscillator is isolated from surrounding logic, wherein said surrounding logic includes circuitry included in a die other than said ring oscillator, and wherein said surrounding logic is in spatial proximity to said ring oscillator.

13. The system of claim 9 wherein said test control generator controls the time period in which said variation clock counter counts said cycles in said variation test clock signal.

14. The system of claim 13 wherein said time period is based on a specified number of cycles in a known frequency signal.

15. The system of claim 9 wherein said variation determination component is a processor arid said timing variation information is communicated via a processor interface.

16. Logic encoded in one or more tangible media for execution and when executed operable to:
propagating a signal through a portion of a circuit to generate a timing variation signal, wherein the frequency of said timing variation signal is determined by the components said timing variation signal is propagated through, and wherein said timing variation signal is adjustable to accommodate testing issues;
tracking cycles of said timing variation signal digitally during a period of time; and
determining a frequency of said signal based upon said cycles of said signal and cycles of known frequency in said period of time, wherein said determining produces a digital value indication of said frequency and a digital value indication of a variation of said frequency from a known frequency, wherein said determining includes comparing a ratio of a variation test signal cycle count and a frequency of said variation test signal to a ratio of a known system clock frequency signal cycle count and said known frequency.

17. A system comprising:
a means for generating a variation test signal associated with an area of a semiconductor chip, wherein the frequency of said variation test signal is determined by the components said variation test signal is propagated through, wherein the frequency of said variation test signal corresponds to timing impacts encountered in said portion of said semiconductor chip, and wherein said variation test signal is adjustable to accommodate testing issues;
a means for digitally counting cycles of said variation test signal;
a means for controlling said counting of said cycles of said variation test signal; and
a means for determining a variation between said variation test signal and a known frequency signal, wherein said means for determining said variation performs a ratio comparison of a variation test signal cycle count from said variation test signal tracking component to a count of cycles in a known system clock frequency signal during said period of time, and wherein said means for determining said variation provides a digital indication of a timing variation for said portion of said semiconductor chip.

18. The timing variation measurement system of claim 17 wherein said digital value is communicated via a processor interface.

19. The timing variation measurement system of claim 17 wherein operations of said means for counting of said variation test signal and said means for controlling said counting of said cycles of said variation test signal are synchronized to begin and stop together.

* * * * *